United States Patent [19]

Smith et al.

[11] Patent Number: 4,750,217

[45] Date of Patent: Jun. 7, 1988

[54] OPTICAL RECEIVERS

[75] Inventors: David R. Smith, Woodbridge; Peter P. Smyth, Ipswich, both of England

[73] Assignee: British Telecommunications public limited company, Great Britain

[21] Appl. No.: 849,515

[22] PCT Filed: Aug. 2, 1985

[86] PCT No.: PCT/GB85/00346

§ 371 Date: Apr. 15, 1986

§ 102(e) Date: Apr. 15, 1986

[87] PCT Pub. No.: WO86/01353

PCT Pub. Date: Feb. 27, 1986

[30] Foreign Application Priority Data

Aug. 3, 1984 [GB] United Kingdom ............... 8419843

[51] Int. Cl.$^4$ .............................................. H04B 9/00
[52] U.S. Cl. .............................. 455/619; 250/214 A; 330/59; 330/308; 455/616; 455/617
[58] Field of Search ............... 455/619, 617, 616, 324; 250/214 A; 329/144; 330/59, 308

[56] References Cited

U.S. PATENT DOCUMENTS 3,801,933  4/1974  Teare ................................... 330/35
4,075,576  2/1978  Eden .................................. 330/277
4,380,828  4/1983  Moon .................................. 455/319

OTHER PUBLICATIONS

Review of Scientific Instruments, vol. 28 #8, Aug. 1977, "Transient CD Measurements at Sub-Millisecond Time Resolution Application to Studies of Temperature-Jump Relaxation of Equilibria of Chiral Biomolecules", pp. 953-962, Anson.

IEEE MTT-S International Microwave Symposium Digest, Jun., "BR-FET: A Band Rejection FET for AMP. and Mixer Applications" P271-273, Tsironsis.

IEEE Global Telecommunications Conf., Dec. 83, "A Review of Technics for Long Wavelength Coherent Optical Fiber Systems" pp. 715-719, Stanley.

Primary Examiner—Robert L. Griffin
Assistant Examiner—Leslie Van Beek
Attorney, Agent, or Firm—Nixon & Vanderhye

[57] ABSTRACT

An optical receiver has a pre-amplifier stage comprising an FET-FET cascode circuit.

For coherent detection, an electrical local oscillator signal is applied to the gate of one of the FETs, the frequency of which is chosen to provide either homodyne demodulation, or a second IF signal.

For direct detection the cascode consists of a dualgate FET, which is also the preferred form of cascode for coherent detection.

35 Claims, 1 Drawing Sheet

OPTICAL RECEIVERS

This invention relates to optical receivers, and in particular to pre-amplifier stages for optical receivers.

Conventionally two kinds of photo detectors for optical receivers have been widely used for the detection of optically transmitted signals. For detection of data transmitted at bit rates up to a few hundred MHz, PIN diode photo detectors, followed by an FET-bipolar transistor cascode pre-amplifier, have generally been preferred because their device and circuit configuration are comparatively simple. However for higher bit rates (1 GHz and above) avalanche photo diode (APD) detectors have been required, mainly because of their greater sensitivity on account of photo current gain, at the penalty of more complex device and circuit configurations.

Improvements in optical transmitter technology, and in particular advances in the manufacture of low loss low dispersion optical fibre, and of narrow spectral line width laser sources, have led to the demonstration, in experimental systems, of transmission over optical fibres at bit rates well in excess of 1 Gbit/s, and further increases in transmission rates are to be expected. In order to exploit these high transmission rates in practical, commercial, optical fibre systems, receivers of commensurate bandwidth capability are required and, to enable fabrication and assembly costs to be kept as low as possible, these receivers should have as simple a structure as possible.

A further development in optical transmission technology which calls for improved receivers, is coherent transmission technology which uses homodyne or heterodyne detection.

The present invention aims to provide a pre-amplifier stage for an optical receiver which gives improved detection bandwidth when used for direct or coherent detection.

Additionally, or alternatively, the present invention aims to provide a pre-amplifier stage specially adapted for use with optical receivers capable of performing coherent heterodyne detection.

According to one aspect of the present invention, a first pre-amplifier stage of an optical receiver comprises a cascode circuit comprising a dual-gate field effect transistor.

The dual-gate field effect transistor is preferably followed by a pre-amplifier output buffer stage comprising an field effect (FET) transistor.

The photo detector is preferably a PIN photo diode.

However, the first pre-amplifier stage may also be used in combination with other photo detector devices, such as, for example, avalanche photo diodes (APDs).

Replacing the conventionally used FET-bipolar transistor cascode circuit by a cascode circuit comprising a dual-gate FET has a number of advantages, the most important of which is that while employing device fabrication techniqes of the same linewidth resolution in the as for conventional pre-amplifier circuits, the operating bandwidth of the pre-amplifier can be substantially increased. Another advantage is that a dual-gate device eases assembly of optical receivers because the number of bonding operations to the pre-amplifier is reduced. Thirdly, by using a further FET transistor in the output buffer stage, the whole pre-amplifier can readily be fabricated as a single integrated circuit device, which may, if desired, form part of a larger integrated circuit.

For direct detection applications, the gate of the second stage of the cascode circuit may, for example, be connected to ground, or to a bias voltage supply.

According to another aspect of the present invention, in an optical heterodyne receiver having a pre-amplifier stage comprising a first field effect transistor and a second transistor connected in cascode, there is applied to the control electrode of one of the transistors of the cascode an intermediate frequency (IF) signal obtained from mixing a received optical signal with a second optical signal, and to the control electrode of the second transistor of the cascode an electrical local oscillator signal.

The electrical local oscillator signal may be of nominally the same frequency as said IF signal, so that mixing with the electrical local oscillator results in demodulation of said IF signal and, hence, of the received signal.

Alternatively, the electrical local oscillator signal may be of a frequency offset from the frequency of said IF signal, so that mixing of the electrical local oscillator signal with said IF signal results in a second IF signal. Usually the local oscillator signal would be chosen such that the second IF is of much lower frequency than said, ie the first, IF signal, in order to reduce the bandwidth needed for subsequent signal processing circuits.

The pre-amplifier of the optical heterodyne receiver preferably comprises a pre-amplifier according to the first aspect of the present invention.

The present invention will now be described further by way of example and with reference to the accompanying drawings of which:

To summarize the relevant background information, the use of avalanche photo diode (APD) detectors in optical fibre communications systems operating in the range of 1–2 Gbit/s at wavelengths of 1.3 and 1.55 is known. (c.f. Smith, D. R. et al, Electronics Letters, 1982, Volume 18, page 192–193). The ternary compound $In_{0.53}Ga_{0.47}As$ has a high absorption coefficient at both 1.3 and 1.55 micrometers, and receiver sensitivities of $-37.5$ and $-38.1$ dBm have been reported at these wavelengths using an InGaAs/InGaAsP/InP avalanche photo diode at 1 Gbit/s transmission rates (c.f. J. C. Campbell et al, Electronics Letters 1983, Volume 19, pages 818–820.) However the need for a combination of low dark current, good frequency response and the required high gain-bandwidth product places conflicting design requirements on the structure of these devices making them extremely difficult to produce.

The good responsivity of indium gallium arsenide PIN photo diodes can, however, be exploited in conventional PIN FET hybrid optical receivers, and such receivers have already been demonstrated to have superior sensitivity, compared with Germanium APDs, at wavelengths of 1.3 and 1.5 micrometers and bit rates of up to 565 M/bts per second, and in addition have negligible temperature dependence and simple low voltage biasing requirements (c.f. "An experimental comparison of a germanium avalanche photo diode and indium gallium arsenide PIN FET receiver for longer wavelength optical communications systems, D R Smith, R C Hooper, P P Smith, D Wake, Electronics Letters, Volume 18 No. 11, pages 453-454, 1982). Until now, however, PIN FET receivers have not been practical for bit rates much in excess of 500 Mbit/s.

Figure 1:
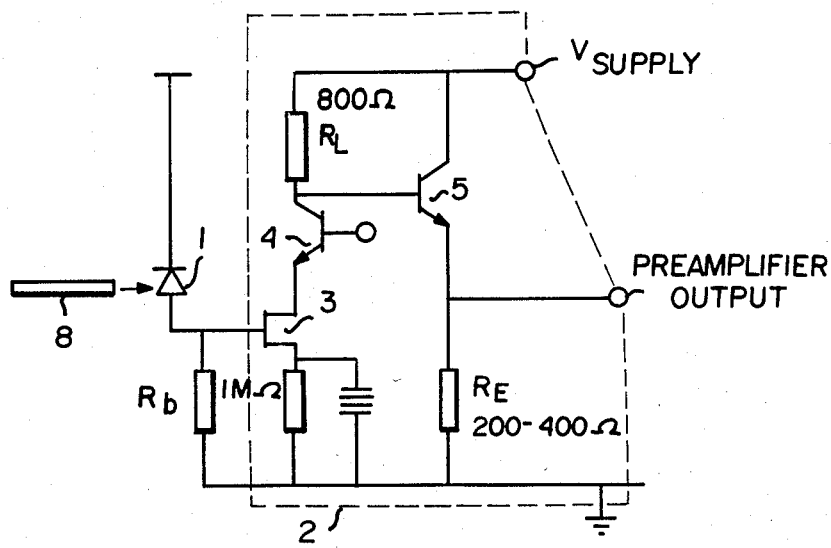
FIG. 1 is a schematic circuit diagram of a pre-amplifier of a commercially available optical receiver circuit.

Referring now to FIG. 1 which shows a circuit diagram of a photo detector and pre-amplifier of a typical known optical receiver comprising a PIN diode photo detector 1 which is optically coupled to an optical fibre 8, and a pre-amplifier 2. The pre-amplifier 2 consists of a first stage comprising an FET input transistor 3 connected in cascode with a bipolar transistor 4, and a pre-amplifier output stage 5 connected to the collector output of the bipolar transistor 4. The output stage consists of a bipolar emitter follower circuit. The PIN photo diode is an InGaAs PIN photo diode and the pre-amplifier configuration, by virtue of its high impedance, is an integrating amplifier. The maximum equalised bandwidth of this receiver is approximately 350 MHz allowing up to 650 Mbit/s operation.

Figure 2:
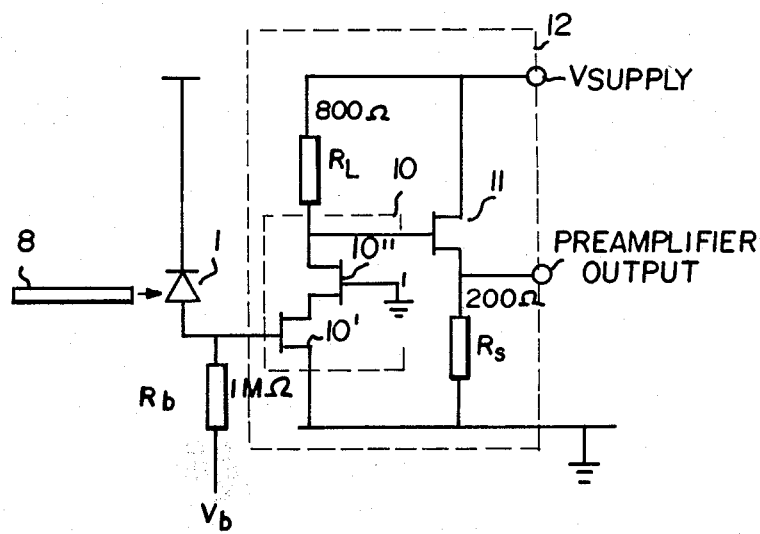
FIG. 2 is a circuit diagram of a pre-amplifier in accordance with the present invention of an optical receiver for direct detection.

Referring now to FIG. 2, a circuit according to the invention has a pre-amplifier stage 12 comprising a dual-gate GaAs FET cascode circuit 10 comprising transistors 10' and 10", and a pre-amplifier output stage comprising an FET source follower 11. The dual-gate FET cascode is connected in series with a load resistor $R_L$. The output from the load resistor $R_L$ is buffered by the source follower circuit 11 whose output is, in turn, coupled into a subsequent signal processing stage (not shown) from the source resistance $R_S$. Dual-gate field effect transistors, which may be said to consist essentially of two field effect transistors sharing a common device area which is the drain for one and the source for the other of the two transistors, are commercially available, and a description of such devices is therefore not considered necessary here.

The circuit operates as follows. The photocurrent $I_p(t)$ injected in the photo diode 1 in response to an optical signal incident on the photo diode develops a signal voltage across the photo diode bias resistor $R_b$ which is applied to the gate of the first FET 10'. The bias resistor $R_b$ provides the return path for the photocurrent, and its bias voltage $V_b$ is controlled by an external feedback loop (not shown) to maintain the gate-to-source voltage $V_{gs}$ of the transistor, and thereby keep the drain-to-source current $I_{ds}$ constant. The value of $V_{gs}$ is chosen to produce a value of $I_{ds}$ for minimum noise from the first FET 10', typically $0.15 I_{dss}$ (the saturated drain source current).

The source follower 11 is used to buffer the output from the load resistor $R_L$ and provide a 50 Ohm or lower output impedance. The advantage of using a source follower for the pre-amplifier output stage is its very low input capacitance. A comparison between the prior art circuit of FIG. 1 and the circuit of FIG. 2 is provided in Table 1, assuming a small area PIN photo diode with a diode capacitance $C_d$ of 0.1 pF and a cascode load resistor of 560 Ohm. The comparison is on the basis of employing the emitter follower 5 to the FET/bipolar cascode, 3,4 of the prior art circuit of FIG. 1, and the source follower 11 to the FET/FET cascode 10', 10" of FIG. 2, so that the performance of these output buffers can also be compared.

TABLE 1

| | FET - bipolar cascode + emitter follower | 1 micrometer dual-gate cascode + source follower |
|---|---|---|
| [Cascode Circuit] | | |
| $C_{in}$ [pF] | $C_{gs}$ | 0.42 |
| $g_m$ | 1 | 0.85 |
| −3 dB Point | 570 MHz | 1.7 GHz |
| $R_{Leff}$ (Ohm) | 560 | 435 |
| $C_{out}$ [pF] (approx.) | 0.25 | 0.08 |
| Gain (approx.) | $g_m R_L$ | 5.52 |
| [Buffer] | | |
| $C_{in}$ [pF] (approx.) | 0.25 | 0.085 |
| $A_{vLF}$ | 0.99 | 0.75 |

It can be seen from this comparison that the use of 1.0 micrometer gate length GaAs FET dualgate transistors for the cascode configuration and a 1.0 micrometer gate length GaAs FET for the pre-amplifier output stage extends the frequency response such that the −3dB point of the frequency response curve of the pre-amplifier lies at approximately 1.7 GHz, compared with a −3dB point of the frequency response curve of the pre-amplifier lies at approximately 1.7 GHz, compared with a −3dB point at only 570 MHz for the FET/bipolar pre-amplifier of the prior art with an emitter follower output buffer.

Higher transconductance and lower input capacitance are obtainable from FETs with smaller gate length, so that receiver sensitivities obtained from the 1 micrometer gate length FET can be yet further improved, and in addition the higher voltage gain of smaller geometry devices will help to offset second stage noise penalties.

The source follower has an order of magnitude less input capacitance than an emitter follower, and this lower capacitance contributes to allowing the extension of the −3dB point to the GHz range. A small geometry gate FET is required to achieve a low-frequency voltage gain $A_{vLF}$ closer to unity in order to reduce transmission loss and minimise input capacitance. The resulting lower value of the gate source capacitance $C_{gs}$ will in turn lead to further reduction in the input capacitance.

Figure 3:
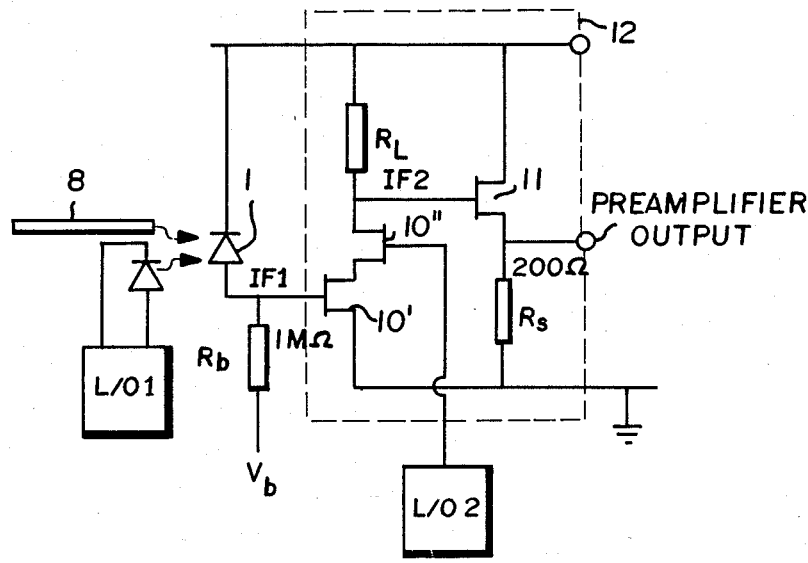
FIG. 3 is a circuit diagram of the pre-amplifier of FIG. 2 modified for coherent detection.

Referring now to FIG. 3, a heterodyne optical receiver employing the pre-amplifier circuit of FIG. 2 has a received optical signal applied to the photo detector diode 1 together with an optical signal generated by a optical local oscillator L/01. The local oscillator L/01 provides a reference signal which, when mixed on the photo diode 1 with the received signal from optical fibre 8 results in a first intermediate frequency signal IF1.

The first IF signal is applied to the gate of FET 10' of the cascode circuit 10',10", and an electrical signal generated by local oscillator L/02 is applied to the gate of the second of transistors 10',10". If the frequency of the first IF signal IF1 is the same as that of the local oxcillator LO/2, then the signal labelled IF2 is, in fact, the demodulated baseband signal from fibre 8. However, if the frequency of the second local oscillator L/02 differs from IF1, then another IF signal, IF2, is generated from the resulting mixing of IF1 and the output signal from L/02.

In summary, by applying to the second stage of a cascode pre-amplifier an electrical local oscillator signal, it is possible to operate the receiver either in a heterodyne-heterodyne mode, or in a heterodyne-homodyne mode, depending on the frequency relationship between the local oscillator generated signal and the IF signal IF1.

We claim:

1. An optical heterodyne receiver having a pre-amplifier stage comprising:
   a field effect transistor and a second transistor connected in cascode, each of said transistors having a control electrode,
   first means arranged to apply to the control electrode of said field effect transistor an intermediate frequency signal obtained from mixing a received optical signal with a further optical signal, and
   second means arranged to apply to the control electrode of the second transistor an electrical local oscillator signal.

2. An optical heterodyne receiver as claimed in claim 1, wherein, said second means is arranged to apply an electrical local oscillator signal of a frequency different from the frequency of said intermediate frequency signal, so that mixing of the electrical local oscillator signal with said intermediate frequency signal results in a second intermediate frequency signal.

3. An optical heterodyne receiver as in claim 1 in which the local frequency is substantially equal to the intermediate frequency.

4. An optical heterodyne receiver as in claim 1 in which the local frequency is different from the intermediate frequency.

5. An optical receiver as in any one of claims 1, 3 or 4 in which the field effect transistor and second transistor together comprise a dual-gate FET.

6. An optical receiver as in any one of claims 1, 2 or 4 which includes an output buffer amplifier comprising an FET.

7. An optical receiver as in any one of claims 1, 2 or 4 in which the first means includes a PIN photo diode.

8. An optical receiver as in claim 1, 2 or 4 wherein the first means includes an avalanche photo diode.

9. An optical receiver as in claim 1, 2 or 4 having an operating bandwidth for received optical signals substantially in excess of 1G bit/second.

10. A method of detecting coherent optical signals in an optical receiver having a cascode pre-amplifier stage comprising a cascode circuit of a field effect transistor and a second transistor, the method comprising:
    applying to one of the transistors of the cascode circuit an intermediate frequency signal derived from mixing a received optical signal with a further optical signal, and
    applying to the other transistor of the cascode an electrical local oscillator signal.

11. A method as in claim 30, wherein a further intermediate frequency signal is obtained by mixing the intermediate frequency signal with an electrical local oscillator signal of a different frequency as the nominal frequency of the intermediate frequency signal, whereby the electrical local oscillator signal is chosen for the further intermediate frequency signal to be of lower frequency than the intermediate frequency signal.

12. A method as in claim 10 wherein the local frequency is substantially equal to the intermediate frequency.

13. A method as in claim 10 wherein the local frequency is different from the intermediate frequency.

14. An optical heterodyne receiver having a pre-amplifier stage comprising:
    a first field effect transistor and a second field effect transistor connected in cascode, each of said transistors having a control electrode,
    first means arranged to apply to the control electrode of said first field effect transistor an intermediate frequency signal obtained from mixing a received optical signal with a further optical signal, and
    second means arranged to apply to the control electrode of the second field effect transistor an electrical local oscillator signal.

15. An optical heterodyne receiver as claimed in claim 14, wherein said second means is arranged to apply an electrical local oscillator signal of a frequency different from the frequency of said intermediate frequency signal, so that mixing of the electrical local oscillator signal with said intermediate frequency signal results in a second intermediate frequency signal.

16. An optical heterodyne receiver as claimed in claim 14 in which the local frequency is substantially equal to the intermediate frequency.

17. An optical heterodyne receiver as claimed in claim 14 in which the local frequency is different from the intermediate frequency.

18. An optical receiver as claimed in any one of claims 14, 16 or 17 in which the first and second FETs together comprise a dual-gate FET.

19. An optical receiver as claimed in any one of claims 14, 16 or 17 which includes an output buffer amplifier comprising a third FET.

20. An optical receiver as claimed in any one of claims 14, 16 or 17 in which the first means includes a PIN photo diode.

21. An optical receiver as in claim 14, 16 or 17 wherein the first means includes an avalanche photo diode.

22. An optical receiver as in claim 14, 16 or 17 wherein the gate of the second field effect transistor is connected to ground potential.

23. An optical receiver as in claim 14, 16 or 17 wherein the gate of the second field effect transistor is connected to a bias voltage supply.

24. An optical receiver as in claim 14, 16 or 17 having an operating bandwidth for received optical signals substantially in excess of 1G bit/second.

25. An optical heterodyne receiver having a preamplifier stage comprising:
    a field effect transistor and a second transistor connected in cascode, each of said transistors having a control electrode;
    first means arranged to apply to the control electrode of said field effect transistor an intermediate frequency signal obtained from mixing a received optical signal with a further optical signal; and
    second means arranged to apply to the control electrode of the second transistor an electrical local oscillator signal;
    wherein said second means is arranged to apply an electrical local oscillator signal of nominally the same frequency as said intermediate frequency signal so that mixing of the latter with the electrical local oscillator signal results in homodyne demodulation of said intermediate frequency signal and, hence, of the received optical signal.

26. An optical heterodyne receiver having a preamplifier stage comprising:
   a field effect transistor and a second transistor connected in cascode, each of said transistors having a control electrode;
   first means arranged to apply to the control electrode of said field effect transistor an intermediate frequency signal obtained from mixing a received optical signal with a further optical signal; and
   second means arranged to apply to the control electrode of the second transistor an electrical local oscillator signal;
   wherein said transistors comprise a dual-gate field effect transistor.

27. A method of detecting coherent optical signals in an optical receiver having a cascode pre-amplifier stage comprising a cascode circuit of a first and a second field effect transistor, the method comprising applying to one of the transistors of the cascode an intermediate frequency signal derived for mixing a received optical signal with a further otical signal, and applying to the other transistor of the cascode lan electrical load oscillator signal.

28. A method as claimed in claim 27, wherein a further intermediate frequency signal is obtained by mixing the intermediate frequency signal with an electrical local oscillator signal of a different frequency as the nominal frequency of the intermediate frequency signal, whereby the electrical local oscillator signal is chosen for the further intermediate frequency signal to be of lower frequency than the intermediate frequency signal.

29. A method as in claim 27 wherein the local frequency is substantially equal to the intermediate frequency.

30. A method as in claim 27 wherein the local frequency is different from the intermediate frequency.

31. A pre-amplifier for an optical heterodyne receiver comprising:
   a field effect transistor having a control element;
   a second transistor having a control element;
   said transistors being connected in a cascode circuit;
   a first of said control elements being adapted for coupling to a signal of an intermediate frequency obtained from mixing a received optical signal with a further optical signal; and
   the second of said control elements being adapted for coupling to an electrical local oscillator signal.

32. A pre-amplifier as in claim 31 further comprising:
   a further field effect transistor connected as a common source amplifier to amplify an electrical signal output from said cascode circuit.

33. A preamplifier for an optical heterodyne receiver comprising:
   a first FET having a gate;
   a second FET having a gate;
   said first and second FET's being connected in a cascode circuit;
   a first of said gates being adapted for coupling to a signal of an intermediate frequency obtained from mixing a received optical signal with a further optical signal; and
   the second of said gates being adapted for coupling to an electrical local oscillator signal.

34. A preamplifier as in claim 33 further comprising:
   a third FET connected as a common source amplifier to amplify an electrical signal output from said cascode circuit.

35. A method of detecting coherent optical signals in an optical receiver having a cascode pre-amplifier stage comprising a cascode circuit of a first and a second field effect transistor, the method comprising:
   applying to one of the transistors of the cascode circuit an intermediate frequency signal derived from mixing a received optical signal with a further optical signal, and
   applying to the other transistor of the cascode an electrical local oscillator signal,
   wherein homodyne demodulation of the intermediate frequency signal is performed by applying an electrical local oscillator signal of nominally the same frequency as the nominal frequency of the intermediate frequency signal.

* * * * *

UNITED STATES PATENT AND TRADEMARK OFFICE
CERTIFICATE OF CORRECTION

PATENT NO. : 4,750,217

DATED : JUNE 7, 1988

INVENTOR(S) : SMITH et al

It is certified that error appears in the above-identified patent and that said Letters Patent is hereby corrected as shown below:

Column 5, claims 6 through 9, first line of each claim delete "2" and replace by -- 3 -- in all instances.

Column 5, claim 11 line 1 delete "30" and replace by -- 10 --

Column 7, claim 27, line 8 delete "lan" and replace by -- an --

Signed and Sealed this

Thirteenth Day of December, 1988

Attest:

DONALD J. QUIGG

Attesting Officer

Commissioner of Patents and Trademarks